(12) United States Patent
Mallik et al.

(10) Patent No.: US 10,090,277 B2
(45) Date of Patent: Oct. 2, 2018

(54) 3D INTEGRATED CIRCUIT PACKAGE WITH THROUGH-MOLD FIRST LEVEL INTERCONNECTS

(71) Applicant: Intel Corporation, Santa Clara, CA (US)

(72) Inventors: Debendra Mallik, Chandler, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/389,278

(22) Filed: Dec. 22, 2016

(65) Prior Publication Data

US 2017/0103970 A1    Apr. 13, 2017

Related U.S. Application Data

(63) Continuation of application No. 14/750,811, filed on Jun. 25, 2015, now Pat. No. 9,530,758, which is a
(Continued)

(51) Int. Cl.
*H01L 25/065* (2006.01)
*H01L 25/00* (2006.01)
(Continued)

(52) U.S. Cl.
CPC ........ *H01L 25/0657* (2013.01); *H01L 21/565* (2013.01); *H01L 21/82* (2013.01);
(Continued)

(58) Field of Classification Search
None
See application file for complete search history.

(56) References Cited

U.S. PATENT DOCUMENTS 5,661,087 A    8/1997  Pedersen et al.
5,969,424 A    10/1999 Matsuki et al.
(Continued)

OTHER PUBLICATIONS

Second Office Action for Chinese Patent Application No. 201180075749.7 dated Dec. 29, 2016, 19 pgs., with English translation.
(Continued)

*Primary Examiner* — Eva Y Montalvo
*Assistant Examiner* — Kevin Quinto
(74) *Attorney, Agent, or Firm* — Schwabe, Williamson & Wyatt, P.C.

(57) ABSTRACT

3D integrated circuit packages with through-mold first level interconnects and methods to form such packages are described. For example, a semiconductor package includes a substrate. A bottom semiconductor die has an active side with a surface area. The bottom semiconductor die is coupled to the substrate with the active side distal from the substrate. A top semiconductor die has an active side with a surface area larger than the surface area of the bottom semiconductor die. The top semiconductor die is coupled to the substrate with the active side proximate to the substrate. The active side of the bottom semiconductor die is facing and conductively coupled to the active side of the top semiconductor die. The top semiconductor die is conductively coupled to the substrate by first level interconnects that bypass the bottom semiconductor die.

17 Claims, 6 Drawing Sheets

Related U.S. Application Data continuation of application No. 13/995,778, filed as application No. PCT/US2011/066986 on Dec. 22, 2011, now Pat. No. 9,099,444.

(51) Int. Cl.
*H01L 21/56* (2006.01)
*H01L 21/82* (2006.01)

(52) U.S. Cl.
CPC .... *H01L 25/50* (2013.01); *H01L 2225/06513* (2013.01); *H01L 2225/06568* (2013.01); *H01L 2225/06582* (2013.01)

(56) References Cited

U.S. PATENT DOCUMENTS

| | | | |
|---|---|---|---|
| 6,525,413 B1* | 2/2003 | Cloud | H01L 25/0652 257/686 |
| 7,777,351 B1* | 8/2010 | Berry | H01L 23/3128 257/778 |
| 2003/0183934 A1 | 10/2003 | Barrett | |
| 2005/0012195 A1 | 1/2005 | Go et al. | |
| 2005/0148121 A1 | 7/2005 | Yamazaki et al. | |
| 2005/0218518 A1 | 10/2005 | Jiang et al. | |
| 2007/0290376 A1* | 12/2007 | Zhao | H01L 21/56 257/787 |
| 2008/0128882 A1 | 6/2008 | Baek et al. | |
| 2009/0032971 A1 | 2/2009 | Chan et al. | |
| 2009/0127676 A1 | 5/2009 | Gomez | |
| 2009/0146281 A1 | 6/2009 | Jung | |
| 2009/0321959 A1 | 12/2009 | Hedler et al. | |
| 2011/0062592 A1 | 3/2011 | Lee et al. | |
| 2011/0068427 A1 | 3/2011 | Paek et al. | |
| 2011/0068459 A1 | 3/2011 | Pagaila et al. | |
| 2011/0068483 A1 | 3/2011 | Katsurayama | |
| 2011/0132885 A1 | 6/2011 | Sercel et al. | |
| 2011/0291232 A1 | 12/2011 | Yen et al. | |
| 2011/0291261 A1 | 12/2011 | Fleischman et al. | |

OTHER PUBLICATIONS

International Preliminary Report on Patentability from PCT/US2011/066986 dated Jul. 3, 2014, 7 pgs.
Non-Final Office Action from U.S. Appl. No. 13/995,778 dated Jun. 18, 2014, 20 pgs.
Search Report from Taiwan Patent Application No. 101145639 dated May 21, 2015, 1 pg.
Final Office Action from U.S. Appl. No. 13/995,778 dated Jan. 9, 2015, 10 pgs.
Non-Final Office Action from U.S. Appl. No. 14/750,811 dated Apr. 15, 2016, 10 pgs.
First Office Action from Chinese Patent Application No. 201180075749.7 dated Apr. 26, 2016, 8 pgs.
Official Letter from Taiwan Patent Application No. 101145639 mailed Aug. 27, 2014, 6 pgs.
International Search Report and Written Opinion for PCT Patent Application No. PCT/US2011/066986 dated Sep. 25, 2012, 10 pgs.
Banijamali, Bahareh, et al., "Advanced Reliability Study of TSV Interposers and Interconnects for the 28nm Technology FPGA", 2011 Electronic Components and Technology Conference, 6 pgs.
Kim, Namhoon, et al., "Interposer Design Optimization for High Frequency Signal Transmission", 2011 Electronic Components and Technology Conference, 8 pgs.
Office Action from German Patent Application No. 112011105992.2 dated Sep. 14, 2017, 10 pgs.
Office Action from Chinese Patent Application No. 201180075749.7, dated May 31, 2018, 20 pages.

\* cited by examiner

3D INTEGRATED CIRCUIT PACKAGE WITH THROUGH-MOLD FIRST LEVEL INTERCONNECTS

CROSS-REFERENCE TO RELATED APPLICATIONS

This application is a continuation of U.S. patent application Ser. No. 14/750,811, filed on Jun. 25, 2015, which is a continuation of U.S. patent application Ser. No. 13/995,778, filed on Jun. 19, 2013, now U.S. Pat. No. 9,099,444, issued on Aug. 4, 2015, which is a U.S. National Phase application under 35 U.S.C. § 371 of International Application No. PCT/US2011/066986, filed Dec. 22, 2011, entitled "3D INTEGRATED CIRCUIT PACKAGE WITH THROUGH-MOLD FIRST LEVEL INTERCONNECTS," the entire contents of which are incorporated herein by reference.

TECHNICAL FIELD

Embodiments of the invention are in the field of packages and, in particular, 3D integrated circuit packages with through-mold first level interconnects and methods to form such packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate. However, this approach may be limited by the size of the mounting area and may not readily accommodate stacked die.

Accordingly, hemispherical C4 solder bumps are formed above an insulation layer and above the exposed surfaces of connector pads (also known as bump pads), each of which is exposed through a via hole in the insulation layer or layers. Subsequently, the solder bumps are heated above their melting point until they reflow and form a connection with the Cu stud bumps of the die. The actual C4 solder bumps may be fabricated using a number of different processing techniques, including evaporation, screen printing, and electroplating. Fabrication by electroplating requires a series of basic operations which typically include the deposition of a metallic seed layer, the application of an imaged photo-resist (in the pattern of C4 solder bumps), the electrodeposition of solder, the stripping of the photo-resist, and the sub-etching of the metallic seed layer to isolate the C4 bumps.

On the other hand, conventional wire-bonding approaches may limit the number of semiconductor die that can reasonably be included in a single semiconductor package. Furthermore, general structural issues may arise when attempting to package a large number of semiconductor die in a semiconductor package. Accordingly, additional improvements are needed in the evolution of semiconductor packages.

SUMMARY

Embodiments of the present invention include 3D integrated circuit packages with through-mold first level interconnects and methods to form such packages.

In an embodiment, a semiconductor package includes a substrate. A bottom semiconductor die has an active side with a surface area. The bottom semiconductor die is coupled to the substrate with the active side distal from the substrate. A top semiconductor die has an active side with a surface area larger than the surface area of the bottom semiconductor die. The top semiconductor die is coupled to the substrate with the active side proximate to the substrate. The active side of the bottom semiconductor die is facing and conductively coupled to the active side of the top semiconductor die. The top semiconductor die is conductively coupled to the substrate by first level interconnects that bypass the bottom semiconductor die.

In another embodiment, a method of fabricating a semiconductor package includes bonding an active side of each of a plurality of singulated first die to a respective active side of a second die on a wafer of a plurality of second dies to form wafer-level first and second die pairs. A molding layer is formed above the first and second die pairs on the wafer-level. From the molding layer side, the wafer is grinded to expose each of the first die and interconnect bumps of each of the second die. The first and second die pairs are singulated. Individual first and second die pairs are then packaged on respective package substrates.

In another embodiment, a semiconductor die pair includes a first semiconductor die having an active side with a surface area. The first semiconductor die includes no through silicon vias (TSVs). A second semiconductor die has an active side with a surface area larger than the surface area of the first semiconductor die. The active side of the first semiconductor die is facing and conductively coupled to the active side of the second semiconductor die. The second semiconductor die includes interconnects that bypass, and are adjacent to, the first semiconductor die.

Figure 1:
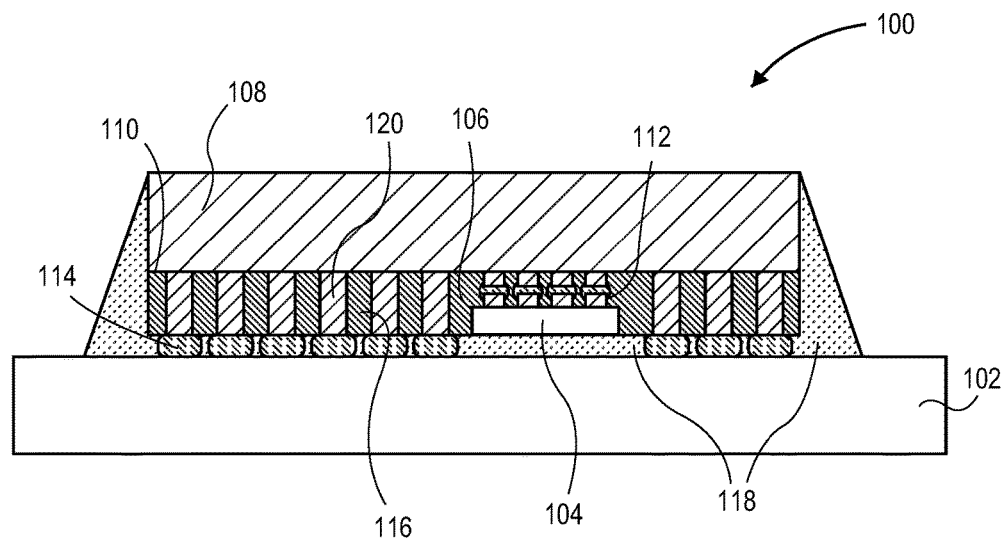
FIG. 1 illustrates a cross-sectional view of a 3D integrated circuit package with through-mold first level interconnects, in accordance with an embodiment of the present invention.

DETAILED DESCRIPTION 3D integrated circuit packages with through-mold first level interconnects and methods to form such packages are described. In the following description, numerous specific details are set forth, such as packaging architectures and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are targeted at three-dimensional (3D) integrated circuit (IC) semiconductor packaging. In an embodiment, the packaging is achieved with the use of through-mold first level interconnects (FLI). Embodiments described herein may include, but need not be limited to the use of 3D stacked die, face-to-face 3D stacking, through-mold FLI, and 3D stacked die on a central processing unit (CPU). Embodiments herein may be targeted for an approximately 10 nanometer node process or beyond. In one or more embodiment, two or more die are stacked without the use of through silicon vias (TSVs) or wire-bonds. A TSV approach is a through approach, whereas a wirebond approach is a bypass approach. One or more embodiments described herein may be characterized as a hybrid through and by-pass approach. In an embodiment, one or more smaller dies are packaged face-to-face with a larger die.

Conventional 3D stacked IC architecture typically requires TSV through at least one of the active die. TSV through active die is expensive, at least in part due to the costs associated with creating the TSVs themselves. Furthermore, costly die area may be consumed by the TSV plus the TSV keep out zone. Accordingly, at least some of the embodiments herein provide a TSV-free approach to 3D packaging.

In a particular embodiment, described in overview form here and in greater detail below, a 3D IC is formed by face-to-face (FtF) stacking of two active devices, e.g., a top active die and a bottom active die, without requiring TSV on either device. The top die is larger than the bottom die. The top die includes tall copper bumps surrounding the bottom die to provide first level interconnection (FLI) to a package substrate. The FLI bumps are embedded inside a molding compound for ease of assembly process and structural protection. The bottom die is electrically connected to the package substrate (e.g., for power delivery, etc.) indirectly through interconnect lines on the top die.

Features described herein and pertaining to one or more embodiments include, but are not limited to, (a) a 3D IC package structure without TSV (e.g., by use of a mixture of short and tall bumps on a top active die to connect to a bottom active die through short bumps and to the package substrate through tall bumps, (b) tall bumps embedded in a molding compound (e.g., performing the molding is carried out on a wafer level, prior to final FLI underfill), (c) FLI bumps through the mold compound are revealed by grinding or laser opening, or a combination thereof, (d) final thinning of a bottom active die is accomplished by grinding of a molded front-side of a stacked die wafer (e.g., to enable extremely thin bottom die such as in the range of 10-20 microns, and (e) permutations and combinations of (a)-(d).

Several specific embodiments are described herein to illustrate the general concepts involved. For example, FIG. 1-4 illustrates cross-sectional views of various 3D integrated circuit packages with through-mold first level interconnects, in accordance with embodiments of the present invention.

In a first example, Referring to FIG. 1, a semiconductor package 100 includes a substrate 102. A bottom semiconductor die 104 has an active side 106 with a surface area. The bottom semiconductor die 104 is coupled to the substrate 102 with the active side 106 distal from the substrate 102. A top semiconductor die 108 has an active side 110 with a surface area larger than the surface area of the bottom semiconductor die 104. The top semiconductor die 108 is coupled to the substrate 102 with the active side 110 proximate to the substrate 102. The active side 106 of the bottom semiconductor die 104 is facing and conductively coupled to the active side 110 of the top semiconductor die 108 by die to die interconnect structures 112 (e.g., composed of soldered bumps from each of the die). The top semiconductor die 108 is conductively coupled to the substrate 102 by first level interconnects 114 that bypass the bottom semiconductor die 104. The top semiconductor die 108 is further conductively coupled to the substrate 102 by a plurality of bumps 120 (e.g., tall copper bumps) that extend from the active side 110 of the top semiconductor die 108 and adjacent to the bottom semiconductor die 104. The plurality of bumps 120 is coupled to the first level interconnects 114. In an embodiment, the bottom semiconductor die 104 and the plurality of bumps 120 are housed in a molding layer 116, as depicted in FIG. 1. In an embodiment, the top semiconductor die 108 and the bottom semiconductor die 104 are further coupled to the substrate 102 by an underfill material layer 118, as is also depicted in FIG. 1.

In an embodiment, the top semiconductor die 108 is configured to provide power to the bottom semiconductor die 104. In an embodiment, the top semiconductor die 108 is configured to facilitate communication between the bottom semiconductor die 104 and the substrate 104, e.g., through routing in the substrate 108. In an embodiment, the bottom semiconductor die 104 has no through silicon vias (TSVs). Thus, connection between the bottom die 104 and substrate 102 is achieved indirectly through interconnect lines on the top die 108 as well as the FLI bumps 114. It is to be understood, however, that, in an alternative embodiment, a bottom die may be connected directly by using TSV on the bottom die.

Thus, in reference to FIG. 1, for a 3D IC with through-mold FLI, bottom and top active die are stacked face-to-face. No TSV may be necessary to achieve such 3D IC stacking. FLI copper bumps are embedded in a molding layer. The top and bottom die have a common interface underfilled by the molding compound. Fabrication-wise, the final 3D IC stacked die with through mold first level interconnect (FLI) is attached to a package substrate, underfilled, and assembled, as described in greater detail below in association with FIGS. 5A-5F.

One or both of the semiconductor die 104 or 108 may be formed from a semiconductor substrate, such as a single crystalline silicon substrate. Other materials, such as, but not limited to, group III-V material and germanium or silicon germanium material substrates may also be considered. The active side (106 or 110, respectively) of the semiconductor die 104 or 108 may be the side upon which semiconductor devices are formed. In an embodiment, the active side 106 or 110 of the semiconductor die 104 or 108, respectively, includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor die may be any appropriate integrated circuit device including but not limited to a microprocessor (single or multi-core), a memory device, a chipset, a graphics device, an application specific integrated circuit according to several different embodiments.

Stacked die apparatus 100 may be particularly suitable for packaging a memory die with a logic die. For example, in an embodiment, one of die 104 or 108 is a memory die. The other die is a logic die. In an embodiment of the present invention, the memory die is a memory device, such as but not limited to a static random access memory (SRAM), a dynamic access memory (DRAM), a nonvolatile memory (NVM) and the logic die is a logic device, such as but not limited to a microprocessor and a digital signal processor.

In accordance with an embodiment of the present invention, one or more of die interconnect structures 112, plurality of bumps 120, or first level interconnects 114 is composed of an array of metal bumps. In one embodiment, each metal bump is composed of a metal such as, but not limited to, copper, gold, or nickel. Substrate 102 may be a flexible substrate or a rigid substrate, depending upon the specific application. In an embodiment, substrate 102 has a plurality of electrical traces disposed therein. In an embodiment, an external contact layer is also formed. In one embodiment, the external contact layer includes a ball grid array (BGA). In other embodiments, the external contact layer includes an array such as, but not limited to, a land grid array (LGA) or an array of pins (PGA).

With respect to molding layer 116, several options may be used to fabricate the layer. In an embodiment, an FLI bump and bottom-die over-mold approach is used. In one embodiment, the over-mold layer is subsequently grinded back to expose the FLI bumps. In one embodiment, grind back is performed close to the bump (e.g., copper bump) and then laser ablation is used to open the copper bumps. Subsequently, solder paste print or micro-ball attach is performed onto the copper bumps. In one embodiment, directly laser open of the copper bumps is performed without any grind back. A solder operation may similarly be performed as above. In another embodiment, bump and bottom die molding are exposed with a polymer film above the FLI bumps and bottom die. No bump exposure is needed; however, cleaning of the FLI Cu bump may be needed by plasma, or laser, etc. In another embodiment, transfer or compression mold is used. In another embodiment, capillary underfill layer formation is extended to cover the FLI bumps in instead of conventional molding. The molding layer 116 may be composed of a non-conductive material. In one embodiment, the molding layer 116 is composed of a material such as, but not limited to, a plastic or an epoxy resin composed of silica fillers. With respect to underfill material layer 118, options include, in an embodiment, mold underfill (MUF) of the LMI interface (e.g., of the die-die interface) during FLI molding, EF-TCB (thermal compression bonding), or underfill prior to molding.

Figure 2:
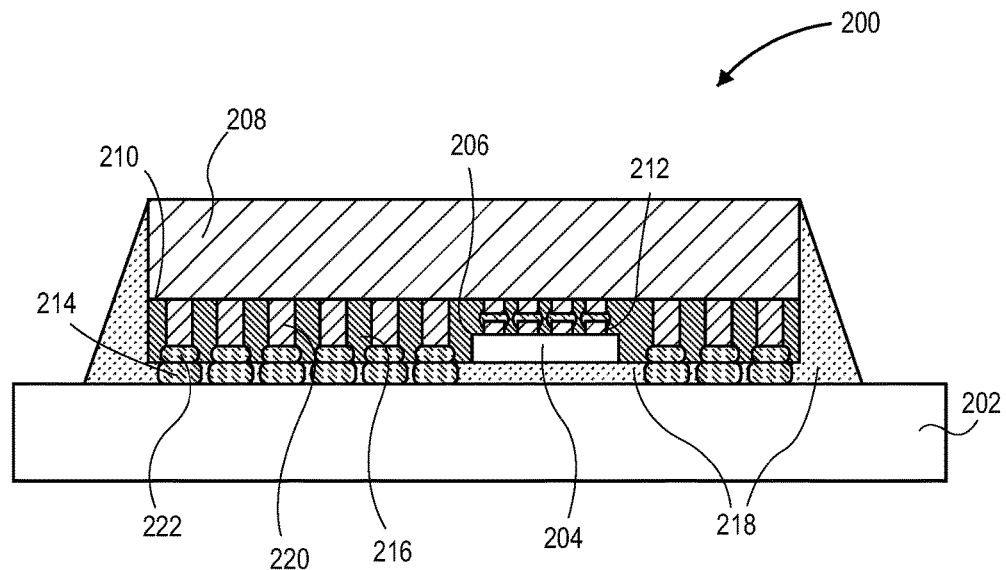
FIG. 2 illustrates a cross-sectional view of a 3D integrated circuit package with through-mold first level interconnects, in accordance with an embodiment of the present invention.

In a second example, Referring to FIG. 2, a semiconductor package 200 includes a substrate 202. A bottom semiconductor die 204 has an active side 206 with a surface area. The bottom semiconductor die 204 is coupled to the substrate 202 with the active side 206 distal from the substrate 202. A top semiconductor die 208 has an active side 210 with a surface area larger than the surface area of the bottom semiconductor die 204. The top semiconductor die 208 is coupled to the substrate 202 with the active side 210 proximate to the substrate 202. The active side 206 of the bottom semiconductor die 204 is facing and conductively coupled to the active side 210 of the top semiconductor die 208 by die to die interconnect structures 212. The top semiconductor die 208 is conductively coupled to the substrate 202 by first level interconnects 214 that bypass the bottom semiconductor die 204. The top semiconductor die 108 is further conductively coupled to the substrate 202 by a plurality of bumps 220 that extend from the active side 210 of the top semiconductor die 208, and at least partially adjacent to the bottom semiconductor die 204, to a plurality of solder balls 222. The plurality of solder balls 222 is coupled to the first level interconnects 214. In an embodiment, the bottom semiconductor die 204, the plurality of bumps 220, and the plurality of solder balls 222 are housed in a molding layer 216, as depicted in FIG. 2. In an embodiment, the top semiconductor die 208 and the bottom semiconductor die 204 are further coupled to the substrate 202 by an underfill material layer 218, as is also depicted in FIG. 2.

Thus, in reference to FIG. 2, another approach for a 3D IC with through-mold FLI includes disposing solder inside a molding layer. The solder may be placed before molding and then exposed by grind back or laser open. Alternatively, solder paste may be placed after laser opening through copper bumps. The characteristics and configurations of the packaged die and the materials of package 200 may be the same or similar to those described above for package 100. In an embodiment, the solder balls 222 are composed of lead or are lead free, such as alloys of gold and tin solder or silver and tin solder.

In reference to FIGS. 1 and 2, mixed FLI bump heights may be used for a top semiconductor die. For example, in one embodiment, a mixed height FLI bump is created by using a top-hat or a slender copper column bumping process. Here, the first bumping mask and plating operation provides short bump heights for both FLI and LMI. The second bumping mask and plating operation provides only the FLI bumps as taller. It is to be understood that various combinations of copper and solder bumping may be performed for FLI, as shown FIGS. 1 and 2.

Figure 3:
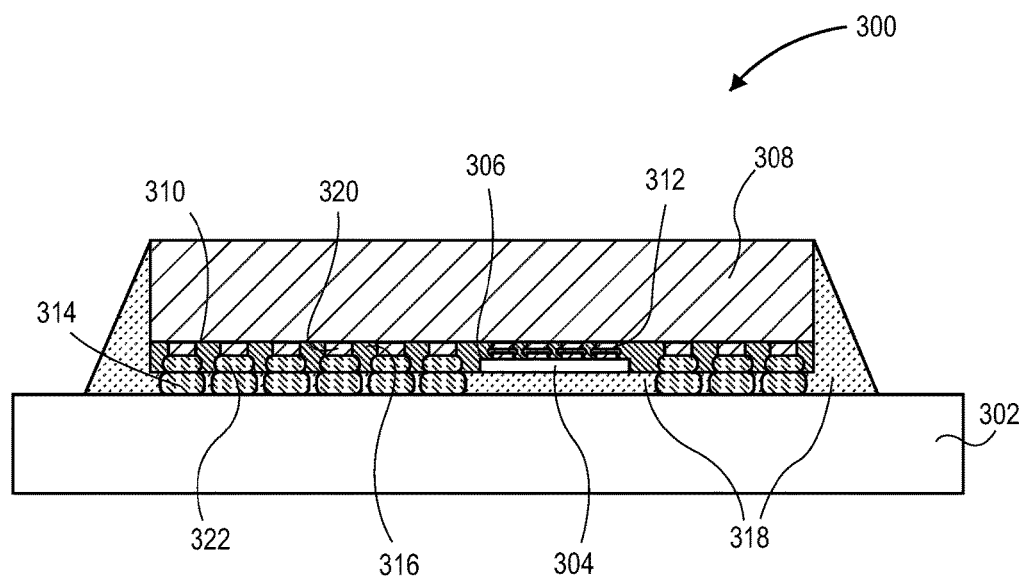
FIG. 3 illustrates a cross-sectional view of a 3D integrated circuit package with through-mold first level interconnects, in accordance with an embodiment of the present invention.

In a third example, Referring to FIG. 3, a semiconductor package 300 includes a substrate 302. A bottom semiconductor die 304 has an active side 306 with a surface area. The bottom semiconductor die 304 is coupled to the substrate 302 with the active side 306 distal from the substrate 302. A top semiconductor die 308 has an active side 310 with a surface area larger than the surface area of the bottom semiconductor die 304. The top semiconductor die 308 is coupled to the substrate 302 with the active side 310 proximate to the substrate 302. The active side 306 of the bottom semiconductor die 304 is facing and conductively coupled to the active side 310 of the top semiconductor die 308 by die to die interconnect structures 312. The top semiconductor die 308 is conductively coupled to the substrate 302 by first level interconnects 314 that bypass the bottom semiconductor die 304. The top semiconductor die 308 is further conductively coupled to the substrate 302 by a plurality of bumps 320 (e.g., short bumps) that extend from the active side 310 of the top semiconductor die 308, but not adjacent to the bottom semiconductor die 304, to a plurality of solder balls 322. The plurality of solder balls 322 is coupled to the first level interconnects 314. In an embodiment, the bottom semiconductor die 304, the plurality of bumps 320, and the plurality of solder balls 322 are housed in a molding layer 316, as depicted in FIG. 3. In an embodiment, the top semiconductor die 308 and the bottom semiconductor die 304 are further coupled to the substrate 302 by an underfill material layer 318, as is also depicted in FIG. 3.

Thus, in reference to FIG. 3, another approach for a 3D IC with through-mold FLI includes fabricating top die FLI and LMI copper bumps of the same height. The solder may be placed before molding and then exposed by grind back or laser open. Alternatively, solder paste may be placed after laser opening the copper bumps. The characteristics and configurations of the packaged die and the materials of package 300 may be the same or similar to those described above for packages 100 or 200.

Figure 4:
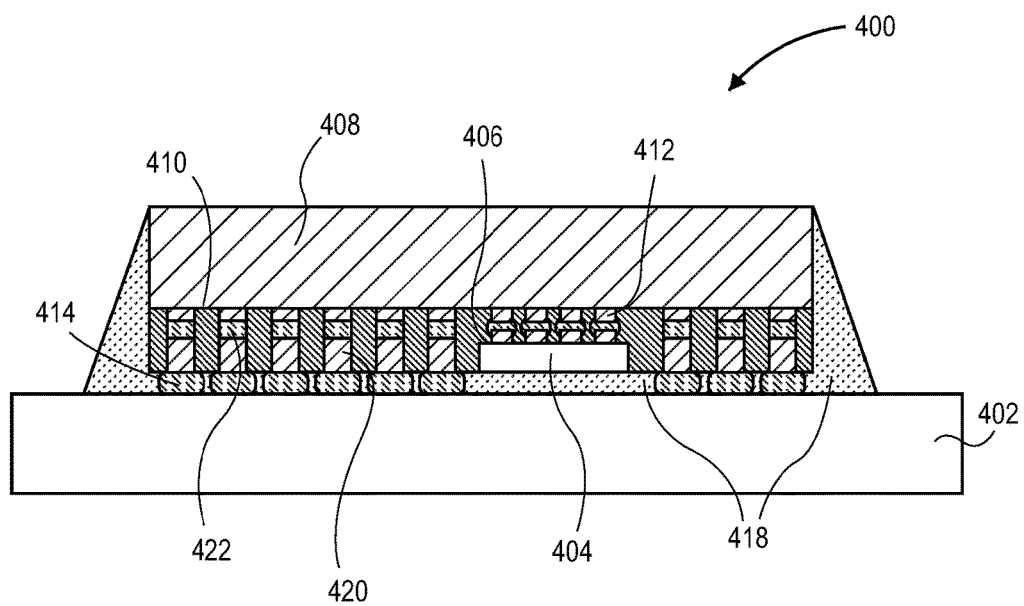
FIG. 4 illustrates a cross-sectional view of a 3D integrated circuit package with through-mold first level interconnects, in accordance with an embodiment of the present invention.

In a fourth example, Referring to FIG. 4, a semiconductor package 400 includes a substrate 402. A bottom semiconductor die 404 has an active side 406 with a surface area. The bottom semiconductor die 404 is coupled to the substrate 402 with the active side 406 distal from the substrate 402. A top semiconductor die 408 has an active side 410 with a surface area larger than the surface area of the bottom semiconductor die 404. The top semiconductor die 408 is coupled to the substrate 402 with the active side 410 proximate to the substrate 402. The active side 406 of the bottom semiconductor die 404 is facing and conductively coupled to the active side 410 of the top semiconductor die 408 by die to die interconnect structures 412. The top semiconductor die 408 is conductively coupled to the substrate 402 by first level interconnects 414 that bypass the bottom semiconductor die 404. The top semiconductor die 408 is further conductively coupled to the substrate 402 by a plurality of bump columns 420 that extend from the active side 410 of the top semiconductor die 408 and adjacent to the bottom semiconductor die 404. The plurality of bump columns 420 include intermediate solder balls 422. The plurality of bump columns 420 is coupled to the first level interconnects 414. In an embodiment, the bottom semiconductor die 404 and the plurality of bump columns 420 are housed in a molding layer 416, as depicted in FIG. 4. In an embodiment, the top semiconductor die 408 and the bottom semiconductor die 404 are further coupled to the substrate 402 by an underfill material layer 418, as is also depicted in FIG. 4.

Thus, in reference to FIG. 4, another approach for a 3D IC with through-mold FLI includes fabricating top die FLI and LMI copper bumps of the same height. Copper bumps are plated over solder. Interlayer dielectric (ILD) stress mitigation may be achieved with such solder positioning. The characteristics and configurations of the packaged die and the materials of package 400 may be the same or similar to those described above for packages 100, 200 or 300.

In another aspect, methods for fabricating 3D integrated circuit packages with through-mold first level interconnects are provided herein. For example, FIGS. 5A-5F illustrate top plan views and cross-sectional views representing various operations in a method of fabricating a semiconductor package, in accordance with an embodiment of the present invention.

Figure 5A:
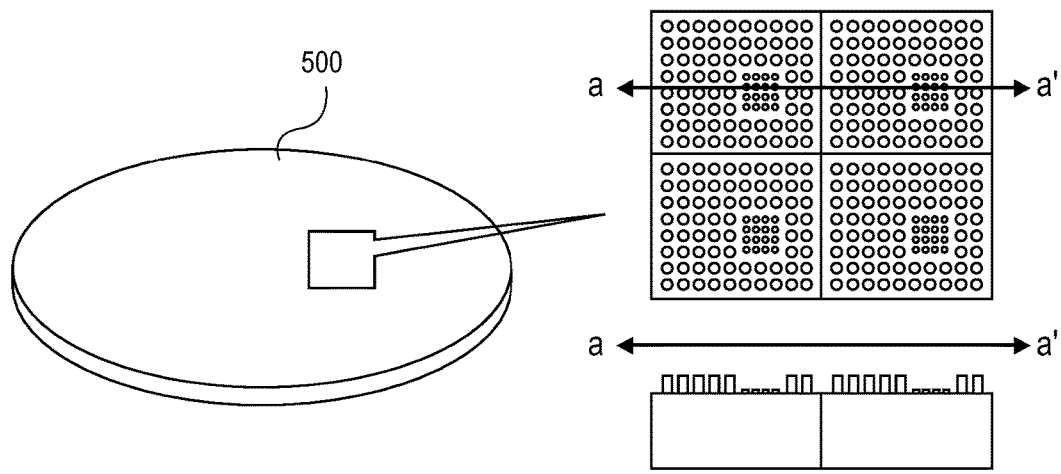
FIG. 5A illustrates a top plan view and a cross-sectional view representing an operation including providing an incoming top die wafer in a method of fabricating a semiconductor package, in accordance with an embodiment of the present invention.
Figure 5B:
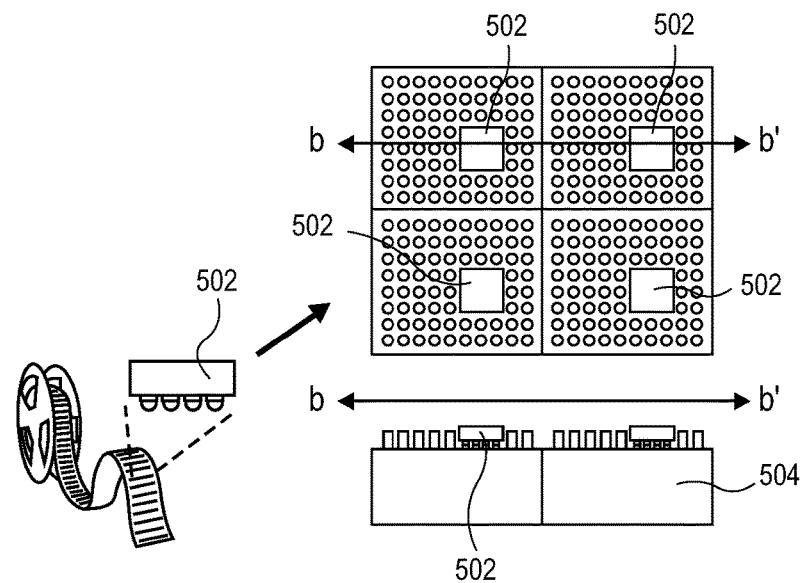
FIG. 5B illustrates a top plan view and a cross-sectional view representing an operation including a bottom die bond die attach (BDA) process in a method of fabricating a semiconductor package, in accordance with an embodiment of the present invention.

Referring to FIG. 5A, an incoming top die wafer 500 is provided. The top die wafer may be of full thickness (e.g., it need not be thinned) and may be scribed, e.g., by a laser scribe process. A cross-section is shown along the a-a' axis. A bottom die 502 bond die attach (BDA) process may then be performed to attach individual bottom dies to wafer level top dies 504, as depicted in FIG. 5B. A cross-section is shown along the b-b' axis. The wafer level bonding may be achieved by CAM or thermal compression bonding (TCB).

Figure 5C:
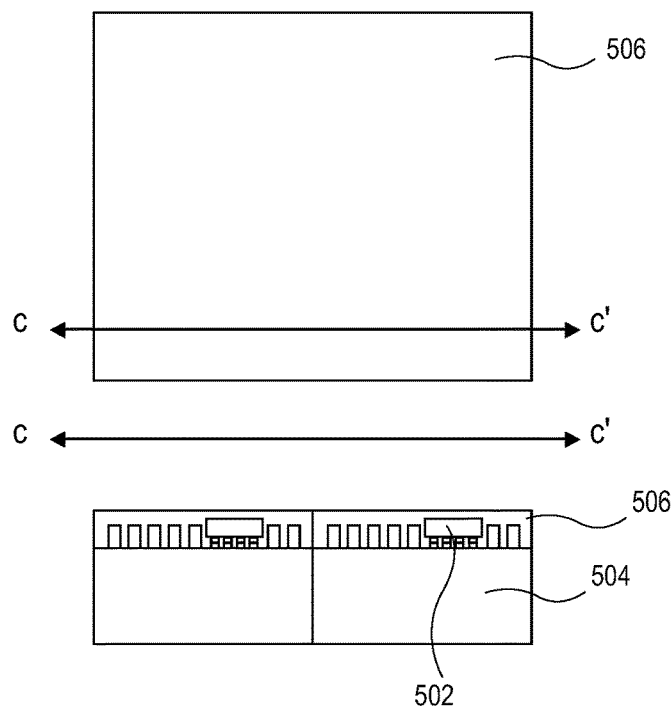
FIG. 5C illustrates a top plan view and a cross-sectional view representing an operation including forming a molding layer at the wafer level in a method of fabricating a semiconductor package, in accordance with an embodiment of the present invention.
Figure 5D:
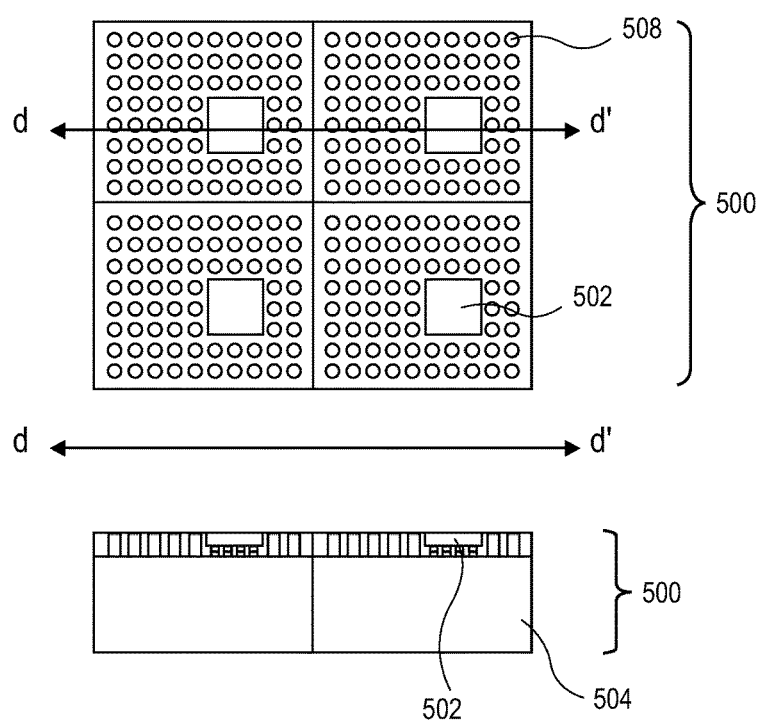
FIG. 5D illustrates a top plan view and a cross-sectional view representing an operation including a wafer front side grind to expose a bottom die and FLI bumps in a method of fabricating a semiconductor package, in accordance with an embodiment of the present invention.

Referring to FIG. 5C, a molding layer 506 is formed over the structure shown in FIG. 5B, at the wafer level. A cross-section is shown along the c-c' axis. The molding layer 506 is, in one embodiment, formed over FLI bumps and a bottom die, and provides underfill if a bottom/top die interface die interface is not pre-underfilled). It is to be understood that the bottom die 502 may instead be exposed as die molded. The wafer 500 front side is then grinded to expose the bottom die 502 and FLI bumps 508, as depicted in FIG. 5D. A cross-section is shown along the d-d' axis.

Figure 5E:
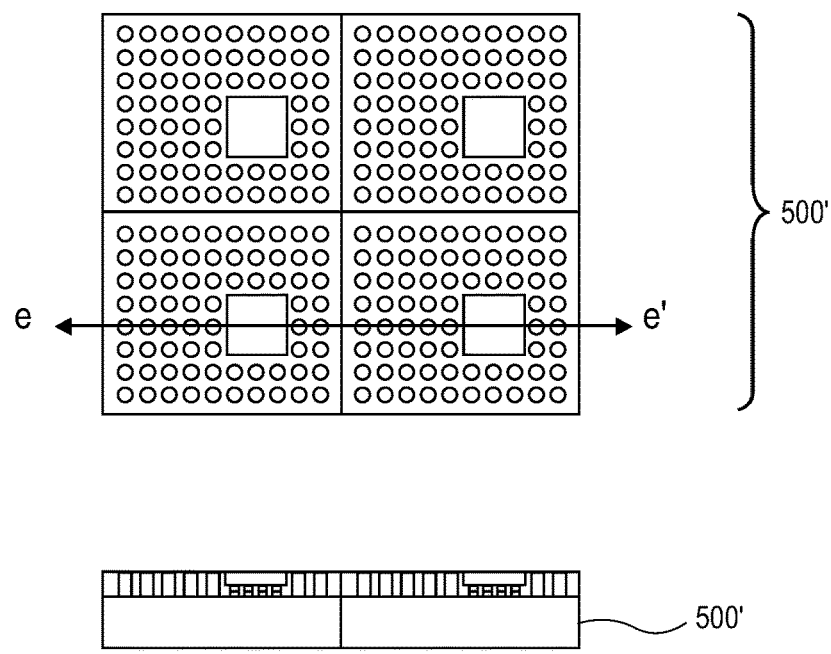
FIG. 5E illustrates a top plan view and a cross-sectional view representing an operation including a wafer back side grind to provide a thinned wafer and to achieve a target thickness of the ultimate top die in a method of fabricating a semiconductor package, in accordance with an embodiment of the present invention.
Figure 5F:
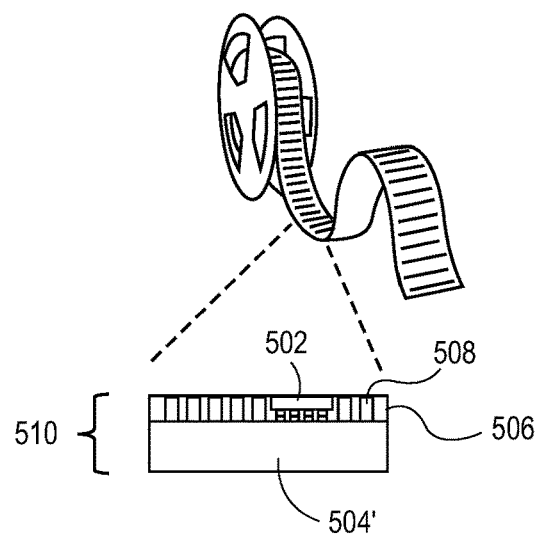
FIG. 5F illustrates a cross-sectional view representing an operation including dicing to provide individual top and bottom die pairs in a method of fabricating a semiconductor package, in accordance with an embodiment of the present invention.

Referring to FIG. 5E, the wafer 500 is subjected to a back side grind to provide a thinned wafer 500 and to achieve a target thickness of the ultimate top die. The process may be similar to conventional wafer thinning. A cross-section is shown along the e-e' axis. Then, the thinned wafer 500' is diced to provide individual die pairs 510, as depicted in FIG. 5F. In the case that a laser scribe is performed, as mention with reference to FIG. 5A, the back side grind of FIG. 5E may be the operation that actually singulated the top and bottom die pairs. It is to be understood that bump field or bottom die edge for top die scribe street locating may be used. The singulated structure 510 includes the attached bottom die 502, the thinned top die 504', the molding layer 506, and the FLI bumps 508. It is to be understood that, upon final assembly, with respect to a receiving substrate, the top die 504' will actually be on top of the bottom die 502.

In an embodiment, solder options include forming no solder inside a molding layer (e.g., only forming copper bumps inside the molding layer). In another embodiment, solder options include forming solder ball or plated solder placed on FLI copper bumps prior to molding and exposing by grind back of a molding layer and/or laser opening the solder. In another embodiment, solder options include providing solder paste or micro-ball placed after grind back and/or laser opening to reveal the FLI copper bumps.

In an embodiment, the process flow described in association with FIGS. 5A-5F includes facilitating use of a thin die as thin as 10-20 microns and enabling fabrication of two different bump heights on a CPU die. In an embodiment, the process flow, or versions thereof, are useful for 3D stacking onto a CPU various other active devices such as small memory die on various CPU cores, wireless chips or small analog devices. In an embodiment, the molding compound used is distinguishable from final FLI underfill due to material and process differences as well as due to a distinct edge profile of the wafer level molding created during top die dicing. In an embodiment, the FLI bump is revealed through grind back and/or laser opening to leave a specific detectable signature on and around the FLI bump.

In another aspect, one or more embodiments herein are targeted at a die pairing, made prior to packaging. For example, in an embodiment, a semiconductor die pair includes a first semiconductor die having an active side with a surface area. The first semiconductor die has no through silicon vias (TSVs). A second semiconductor die has an active side with a surface area larger than the surface area of the first semiconductor die. The active side of the first semiconductor die faces and is conductively coupled to the active side of the second semiconductor die. The second semiconductor die includes interconnects that bypass, and are adjacent to, the first semiconductor die.

In one such embodiment, the interconnects of the second semiconductor die include a plurality of bumps that extend from the active side of the second semiconductor die and adjacent to the first semiconductor die. In a specific such embodiment, the first semiconductor die and the plurality of bumps are housed in a molding layer.

In another such embodiment, the interconnects of the second semiconductor die include a plurality of bumps that extend from the active side of the second semiconductor die, and at least partially adjacent to the first semiconductor die, and further to a plurality of solder balls. In a specific such embodiment, the first semiconductor die, the plurality of bumps, and the plurality of solder balls are housed in a molding layer.

In another such embodiment, the interconnects of the second semiconductor die include a plurality of bumps that extend from the active side of the second semiconductor die, but not adjacent to the first semiconductor die, and further to a plurality of solder balls. In a specific such embodiment, the bottom semiconductor die, the plurality of bumps, and the plurality of solder balls are housed in a molding layer.

In another such embodiment, the interconnects of the second semiconductor die include a plurality of bump columns that extend from the active side of the second semiconductor die and adjacent to the first semiconductor die. The plurality of bump columns are composed of intermediate solder balls. In a specific such embodiment, the bottom semiconductor die and the plurality of bump columns are housed in a molding layer.

In an embodiment, the second semiconductor die is configured to provide power to the first semiconductor die.

Figure 6:
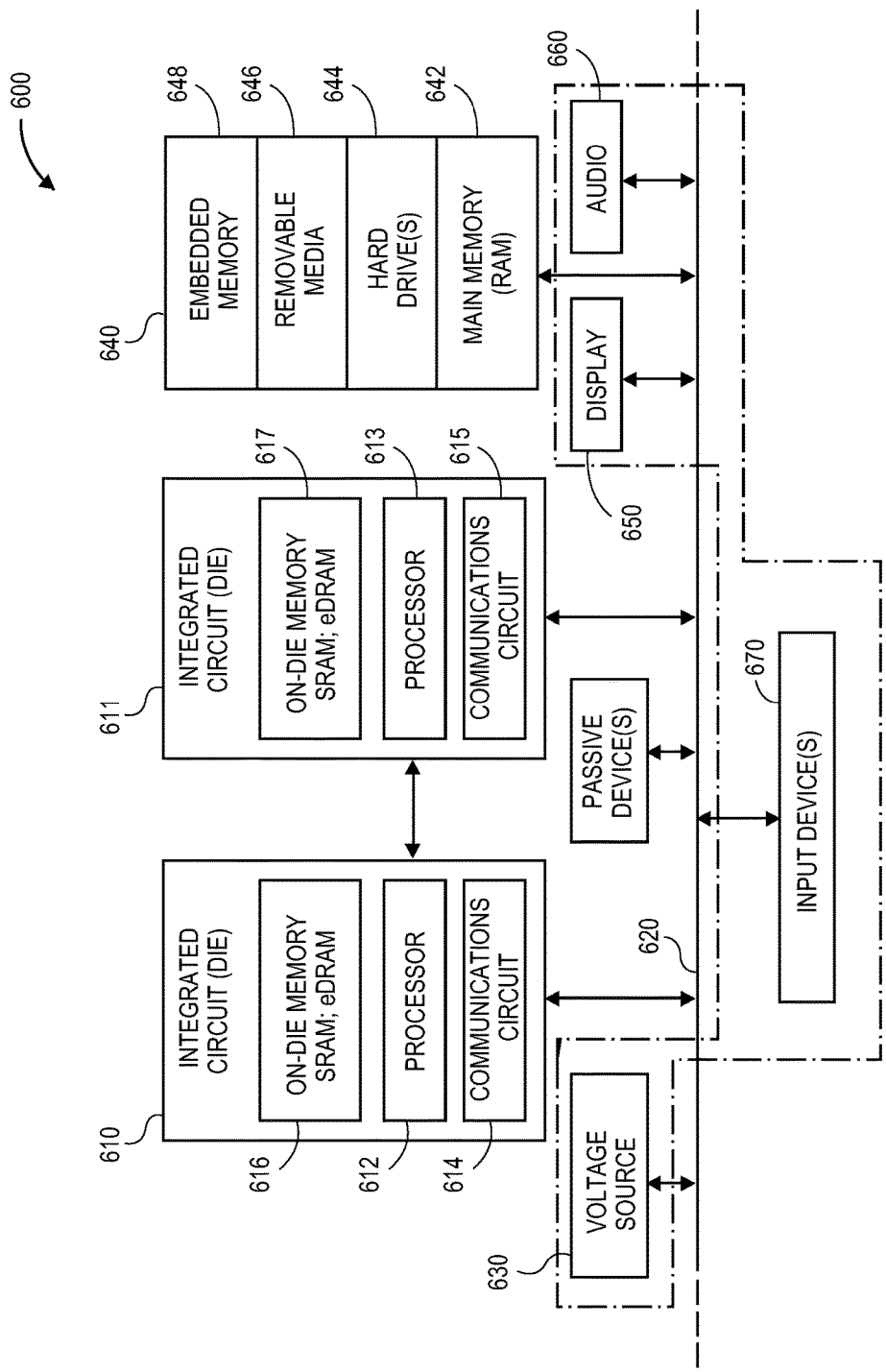
FIG. 6 is a schematic of a computer system, in accordance with an embodiment of the present invention.

FIG. 6 is a schematic of a computer system 600, in accordance with an embodiment of the present invention. The computer system 600 (also referred to as the electronic system 600) as depicted can embody a 3D integrated circuit package with through-mold first level interconnects according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 is a 3D integrated circuit package with through-mold first level interconnects disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems. In an embodiment, the processor 610 includes on-die memory 616 such as static random-access memory (SRAM). In an embodiment, the processor 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in a 3D integrated circuit package with through-mold first level interconnects, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a 3D integrated circuit package with through-mold first level interconnects according to any of the several disclosed embodiments and their equivalents, an electronic system, a computer system, one or more methods of fabricating an integrated circuit, and one or more methods of fabricating an electronic assembly that includes a 3D integrated circuit package with through-mold first level interconnects according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed 3D integrated circuit package with through-mold first level interconnects embodiments and their equivalents.

Thus, 3D integrated circuit packages with through-mold first level interconnects and methods to form such packages have been disclosed. In an embodiment, a semiconductor package includes a substrate. A bottom semiconductor die has an active side with a surface area. The bottom semiconductor die is coupled to the substrate with the active side distal from the substrate. A top semiconductor die has an active side with a surface area larger than the surface area of the bottom semiconductor die. The top semiconductor die is coupled to the substrate with the active side proximate to the substrate. The active side of the bottom semiconductor die is facing and conductively coupled to the active side of the top semiconductor die. The top semiconductor die is conductively coupled to the substrate by first level interconnects that bypass the bottom semiconductor die. In one such embodiment, the bottom semiconductor die has no through silicon vias (TSVs).

What is claimed is:

1. A semiconductor package, comprising:
a substrate;
a bottom semiconductor die above the substrate, the bottom semiconductor die having lower and upper opposing surfaces and having opposing side surfaces;
a top semiconductor die over the bottom semiconductor die, the top semiconductor die having lower and upper opposing surfaces and having opposing side surfaces, wherein the opposing side surfaces of the top semiconductor die extend beyond the opposing side surfaces of the bottom semiconductor die;
a mold material between a first portion of the lower surface of the top semiconductor die and the upper surface of the bottom semiconductor die, the mold material further in a region between a second portion of the lower surface of the top semiconductor die and the substrate laterally adjacent to the bottom semiconductor die, wherein the mold material has a lower surface substantially co-planar with the lower surface of the bottom semiconductor die, and wherein the mold material has side surfaces substantially co-planar with the opposing side surfaces of the top semiconductor die; and
an underfill material laterally adjacent to and in contact with the side surfaces of the mold material, and laterally adjacent to and in contact with the opposing side surfaces of the top semiconductor die.

2. The semiconductor package of claim 1, wherein the underfill material is further between the lower surface of the mold material and the substrate.

3. The semiconductor package of claim 1, wherein the top semiconductor die is electrically coupled to the substrate by a plurality of bumps that extend from the lower surface of the top semiconductor die through the mold material to the lower surface of the mold material, the plurality of bumps laterally adjacent to the bottom semiconductor die.

4. The semiconductor package of claim 1, wherein the top semiconductor die is configured to provide power to the bottom semiconductor die.

5. The semiconductor package of claim 1, wherein the top semiconductor die is configured to facilitate communication between the bottom semiconductor die and the substrate.

6. The semiconductor package of claim 1, wherein the bottom semiconductor die comprises no through silicon vias (TSVs).

7. A semiconductor package, comprising:
a substrate;
a bottom semiconductor die above the substrate, the bottom semiconductor die having lower and upper opposing surfaces and having opposing side surfaces;
a top semiconductor die over the bottom semiconductor die, the top semiconductor die having lower and upper opposing surfaces and having opposing side surfaces, wherein the opposing side surfaces of the top semiconductor die extend beyond the opposing side surfaces of the bottom semiconductor die;
a mold material between a first portion of the lower surface of the top semiconductor die and the upper surface of the bottom semiconductor die, the mold material further in a region between a second portion of the lower surface of the top semiconductor die and the substrate laterally adjacent to the bottom semiconductor die, wherein the mold material has a lower surface substantially co-planar with the lower surface of the bottom semiconductor die, and wherein the mold material has side surfaces substantially co-planar with the opposing side surfaces of the top semiconductor die, wherein the top semiconductor die is electrically coupled to the substrate by a plurality of bumps that extend from the lower surface of the top semiconductor die through the mold material to the lower surface of the mold material, the plurality of bumps laterally adjacent to the bottom semiconductor die; and
a plurality of solder balls electrically coupling the plurality of bumps to the substrate, wherein a portion of individual ones of the plurality of solder balls is in contact with the lower surface of the mold material.

8. A semiconductor package, comprising:
a substrate;
a bottom semiconductor die above the substrate, the bottom semiconductor die having lower and upper opposing surfaces and having opposing side surfaces;
a top semiconductor die over the bottom semiconductor die, the top semiconductor die having lower and upper opposing surfaces and having opposing side surfaces, wherein the opposing side surfaces of the top semiconductor die extend beyond the opposing side surfaces of the bottom semiconductor die; and
a mold material between a first portion of the lower surface of the top semiconductor die and the upper surface of the bottom semiconductor die, the mold material further in a region between a second portion of the lower surface of the top semiconductor die and the substrate laterally adjacent to the bottom semiconductor die, wherein the mold material has a lower surface substantially co-planar with the lower surface of the bottom semiconductor die, and wherein the mold material has side surfaces substantially co-planar with the opposing side surfaces of the top semiconductor die, wherein the top semiconductor die is electrically coupled to the substrate by a plurality of upper bump and lower solder ball pairings that extend from the lower surface of the top semiconductor die through the mold material to the lower surface of the mold material, the plurality of upper bump and lower solder ball pairings laterally adjacent to the bottom semiconductor die.

9. The semiconductor package of claim 8, further comprising:
a plurality of solder balls electrically coupling the solder balls of the plurality of upper bump and lower solder ball pairings to the substrate, wherein a portion of individual ones of the plurality of solder balls is in contact with the lower surface of the mold material.

10. The semiconductor package of claim 8, wherein the upper bumps of the plurality of upper bump and lower solder ball pairings are laterally adjacent to a portion of the bottom semiconductor die.

11. The semiconductor package of claim 8, wherein the upper bumps of the plurality of upper bump and lower solder ball pairings are not laterally adjacent to any portion of the bottom semiconductor die.

12. A semiconductor package, comprising:
a substrate;
a bottom semiconductor die above the substrate, the bottom semiconductor die having lower and upper opposing surfaces and having opposing side surfaces;
a top semiconductor die over the bottom semiconductor die, the top semiconductor die having lower and upper opposing surfaces and having opposing side surfaces, wherein the opposing side surfaces of the top semiconductor die extend beyond the opposing side surfaces of the bottom semiconductor die; and
a mold material between a first portion of the lower surface of the top semiconductor die and the upper surface of the bottom semiconductor die, the mold material further in a region between a second portion of the lower surface of the top semiconductor die and the substrate laterally adjacent to the bottom semiconductor die, wherein the mold material has a lower surface substantially co-planar with the lower surface of the bottom semiconductor die, and wherein the mold material has side surfaces substantially co-planar with the opposing side surfaces of the top semiconductor die, wherein the top semiconductor die is electrically coupled to the substrate by a plurality of bump columns that extend from the lower surface of the top semiconductor die through the mold material to the lower surface of the mold material, the plurality of bump columns laterally adjacent to the bottom semiconductor die, wherein individual ones of the plurality of bump columns comprise intermediate solder balls.

13. The semiconductor package of claim 12, further comprising:
a plurality of solder balls electrically coupling the plurality of bump columns to the substrate, wherein a portion of individual ones of the plurality of solder balls is in contact with the lower surface of the mold material.

14. A semiconductor die pairing, comprising:
a bottom semiconductor die having lower and upper opposing surfaces and having opposing side surfaces;
a top semiconductor die over the bottom semiconductor die, the top semiconductor die having lower and upper opposing surfaces and having opposing side surfaces, wherein the opposing side surfaces of the top semiconductor die extend beyond the opposing side surfaces of the bottom semiconductor die; and
a mold material between a first portion of the lower surface of the top semiconductor die and the upper surface of the bottom semiconductor die, the mold material further laterally adjacent to the bottom semiconductor die, wherein the mold material has a lower surface substantially co-planar with the lower surface of the bottom semiconductor die, and wherein the mold material has side surfaces substantially co-planar with the opposing side surfaces of the top semiconductor die; and
a plurality of upper bump and lower solder ball pairings that extend from the lower surface of the top semiconductor die through the mold material to the lower surface of the mold material, the plurality of upper bump and lower solder ball pairings laterally adjacent to the bottom semiconductor die.

15. The semiconductor die pairing of claim 14, wherein the upper bumps of the plurality of upper bump and lower solder ball pairings are laterally adjacent to a portion of the bottom semiconductor die.

16. The semiconductor die pairing of claim 14, wherein the upper bumps of the plurality of upper bump and lower solder ball pairings are not laterally adjacent to any portion of the bottom semiconductor die.

17. A semiconductor die pairing, comprising:
a bottom semiconductor die having lower and upper opposing surfaces and having opposing side surfaces;
a top semiconductor die over the bottom semiconductor die, the top semiconductor die having lower and upper opposing surfaces and having opposing side surfaces, wherein the opposing side surfaces of the top semiconductor die extend beyond the opposing side surfaces of the bottom semiconductor die;
a mold material between a first portion of the lower surface of the top semiconductor die and the upper surface of the bottom semiconductor die, the mold material further laterally adjacent to the bottom semiconductor die, wherein the mold material has a lower surface substantially co-planar with the lower surface of the bottom semiconductor die, and wherein the mold material has side surfaces substantially co-planar with the opposing side surfaces of the top semiconductor die; and
a plurality of bump columns that extend from the lower surface of the top semiconductor die through the mold material to the lower surface of the mold material, the plurality of bump columns laterally adjacent to the bottom semiconductor die, wherein individual ones of the plurality of bump columns comprise intermediate solder balls.

* * * * *